United States Patent
Lee et al.

(10) Patent No.: US 9,515,126 B2
(45) Date of Patent: Dec. 6, 2016

(54) PHOTOELECTRIC CONVERSION DEVICE HAVING IMPROVED EXTERNAL QUANTUM EFFICIENCY AND IMAGE SENSOR HAVING THE SAME

(71) Applicant: Samsung Electronics Co., Ltd., Suwon-si, Gyeonggi-do (KR)

(72) Inventors: Gae Hwang Lee, Seongnam-si (KR); Kwang Hee Lee, Yongin-si (KR); Kyung Bae Park, Hwaseong-si (KR); Sung Young Yun, Suwon-si (KR); Yong Wan Jin, Seoul (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/657,506

(22) Filed: Mar. 13, 2015

(65) Prior Publication Data

US 2016/0064456 A1   Mar. 3, 2016

(30) Foreign Application Priority Data

Aug. 29, 2014 (KR) .................. 10-2014-0114367

(51) Int. Cl.
*H01L 29/08* (2006.01)
*H01L 27/30* (2006.01)
*H01L 27/146* (2006.01)

(52) U.S. Cl.
CPC ....... *H01L 27/307* (2013.01); *H01L 27/14621* (2013.01); *H01L 27/14627* (2013.01); *H01L 27/14645* (2013.01); *H01L 27/14665* (2013.01); *Y02E 10/549* (2013.01)

(58) Field of Classification Search
CPC ...... H01L 27/307; H01L 51/42; H01L 51/442; H01L 51/0046
USPC .......................................................... 257/40
See application file for complete search history.

(56) References Cited

U.S. PATENT DOCUMENTS

| | | | |
|---|---|---|---|
| 8,071,414 B2 | 12/2011 | Yu et al. | |
| 8,586,967 B2 | 11/2013 | Xue et al. | |
| 8,614,440 B2 | 12/2013 | Sramek et al. | |
| 2005/0217722 A1 | 10/2005 | Komatsu et al. | |
| 2007/0057339 A1* | 3/2007 | Mitsui | H01L 27/14647 257/432 |
| 2007/0194400 A1* | 8/2007 | Yokoyama | H01L 27/14601 257/443 |
| 2007/0205477 A1* | 9/2007 | Yokoyama | H01L 27/14647 257/429 |
| 2009/0084438 A1* | 4/2009 | den Boer | H01L 31/02168 136/256 |

(Continued)

FOREIGN PATENT DOCUMENTS

| | | |
|---|---|---|
| DE | 102009043348 A1 | 4/2011 |
| KR | 20140044336 A | 4/2014 |

*Primary Examiner* — Caleb Henry
(74) *Attorney, Agent, or Firm* — Harness, Dickey & Pierce, P.L.C.

(57) ABSTRACT

A photoelectric conversion device of an image sensor includes a first transparent electrode layer, an active layer, and a second transparent electrode layer, which are sequentially stacked. A light having a wavelength of about 440 nm-480 nm is absorbed within a depth of about ⅕ of an entire thickness of the active layer from both the top and bottom surfaces of the active layer.

20 Claims, 12 Drawing Sheets

(56) References Cited

U.S. PATENT DOCUMENTS

| | | | |
|---|---|---|---|
| 2009/0085029 A1* | 4/2009 | Mitsui | H01L 51/0051 257/40 |
| 2009/0189058 A1* | 7/2009 | Mitsui | B82Y 10/00 250/208.1 |
| 2009/0223566 A1* | 9/2009 | Mitsui | B82Y 10/00 136/263 |
| 2009/0283758 A1* | 11/2009 | Nomura | C07D 407/06 257/40 |
| 2010/0102303 A1* | 4/2010 | Nomura | C07D 277/30 257/40 |
| 2010/0154881 A1* | 6/2010 | Huang | H01L 31/02168 136/256 |
| 2011/0069000 A1* | 3/2011 | Su | H01L 51/5215 345/76 |
| 2012/0001289 A1* | 1/2012 | Ahn | H01L 27/14621 257/432 |
| 2012/0091020 A1 | 4/2012 | Glinert et al. | |
| 2013/0087682 A1* | 4/2013 | Nomura | C09B 23/105 250/206 |
| 2013/0105768 A1 | 5/2013 | Leem et al. | |
| 2013/0321897 A1* | 12/2013 | Wang | G02F 1/0126 359/299 |
| 2014/0110695 A1 | 4/2014 | Benwadih | |
| 2014/0118579 A1* | 5/2014 | Kim | H04N 9/045 348/242 |
| 2014/0346053 A1* | 11/2014 | Deguchi | C25B 9/08 205/340 |
| 2014/0346628 A1* | 11/2014 | Okazaki | H01L 27/14623 257/432 |
| 2015/0048317 A1* | 2/2015 | Sasaki | H01L 27/1464 257/40 |

* cited by examiner

PHOTOELECTRIC CONVERSION DEVICE HAVING IMPROVED EXTERNAL QUANTUM EFFICIENCY AND IMAGE SENSOR HAVING THE SAME

RELATED APPLICATIONS

This application claims priority to and the benefit of Korean Patent Application No. 10-2014-0114367 filed in the Korean Intellectual Property Office on Aug. 29, 2014, the entire contents of which are incorporated herein by reference.

BACKGROUND

1. Field

Example embodiments provide a photoelectric conversion device and an image sensor.

2. Description of the Related Art

A digital camera and a camcorder may include an image sensor to store an electrical signal for an image, and the image sensor separates incident light into three primary colors of red, green, and blue, and converts each of them into an electrical signal.

The image sensor filters one color of light including three primary colors, and the filtered light is sensed by a photodiode through photoelectric conversion. The image sensor may also sense light by using a photodiode reacting with one of the three primary colors.

In conventional photoelectric conversion image sensors, organic material photoelectric conversion devices are used which react only with green light elements to produce the photoelectric conversion.

SUMMARY

The photoelectric conversion occurs when green light sensing organic photoelectric conversion device reacts with blue or red light. Photoelectric conversion current caused by the blue light or red light may be filtered as noise when the conversion current is about constant. However, when the photoelectric conversion current caused by the blue light or red light changes according to a bias voltage, it may be difficult to filter the photoelectric conversion current as noise. As a result, the color of a captured image may be influenced/deteriorated by the ambient light intensity.

This is because the external quantum efficiency (EQE) spectrum of an organic photoelectric conversion device changes according to an applied/bias voltage. A device structure configured for solving the above problem is desired.

The image sensor, according to an example embodiment, includes a first photoelectric conversion device including a first transparent electrode layer, an active layer, and a second transparent electrode layer, which are sequentially stacked, and light having a wavelength of about 440 nm-480 nm is absorbed within a depth of about ⅕ of an entire thickness of the active layer from both the top and bottom surfaces of the active layer.

The first transparent electrode layer may satisfy:

$120N-(30-5N) \leq$ refractive index of first transparent electrode layer×thickness (nm) of first transparent electrode layer $\leq 120N+(30-5N)$, wherein $N$ is a natural number.

The first transparent electrode layer may include ITO, and the image sensor may further include a P-type doping layer and a hole transport layer (HTL) disposed between the active layer and the second transparent electrode layer.

The image sensor may further include a substrate including a second photoelectric conversion device disposed under the first transparent electrode layer, and a first color filter, a second color filter, a conductive connecting member, and an insulation layer disposed between the substrate and the first transparent electrode layer. The insulation layer may be disposed between the first transparent electrode layer and the first color filter and between the first transparent electrode layer and the second color filter, the insulation layer may include silicon oxide, and the active layer may include C60.

The image sensor may further include a substrate including a second photoelectric conversion device and disposed under the first transparent electrode layer, and an optical buffer layer disposed at at least one of between the first transparent electrode layer and the active layer and between the first transparent electrode layer and the substrate. The first transparent electrode layer and the optical buffer layer may satisfy:

$120N-(30-5N) \leq$ refractive index of first transparent electrode layer×thickness (nm) of first transparent electrode layer+refractive index of optical buffer layer×thickness (nm) of optical buffer layer $\leq 120N+(30-5N)$, wherein $N$ is a natural number.

A difference between the refractive index of optical buffer layer and the refractive index of the first transparent electrode layer is greater than or equal to about 0.2, and the optical buffer layer may play a role of a hole blocking layer or an electron transport layer (ETL).

The optical buffer layer may include a first optical buffer layer disposed between the first transparent electrode layer and the active layer and a second optical buffer layer disposed between the first transparent electrode layer and the substrate, and the first transparent electrode layer, the first optical buffer layer, and the second optical buffer layer may satisfy:

$120N-(30-5N) \leq$ refractive index of first transparent electrode layer×thickness (nm) of first transparent electrode layer+refractive index of first optical buffer layer×thickness (nm) of first optical buffer layer+refractive index of second optical buffer layer×thickness (nm) of second optical buffer layer $\leq 120N+(30-5N)$, where $N$ is a natural number.

The first optical buffer layer may play a role of a hole blocking layer or an electron transport layer (ETL).

The image sensor, according to an embodiment, includes a photoelectric conversion device including an optical buffer layer, a first transparent electrode layer disposed on the optical buffer layer, an active layer disposed on the first transparent electrode layer, and a second transparent electrode layer disposed on the active layer, and the optical buffer layer has a refractive index of greater than or equal to about 1.7.

The first transparent electrode layer and the optical buffer layer may satisfy:

$120N-(30-5N) \leq$ refractive index of first transparent electrode layer×thickness (nm) of first transparent electrode layer+refractive index of optical buffer layer×thickness (nm) of optical buffer layer $\leq 120N+(30-5N)$, wherein $N$ is a natural number.

The image sensor may further include a hole transport layer, a P-type doping layer disposed between the active layer and the second transparent electrode layer, and an insulation layer disposed under the optical buffer layer, the first transparent electrode layer may include ITO, the active layer may include C60, and the insulation layer may include a silicon oxide.

The photoelectric conversion device, according to an example embodiment, includes a first transparent electrode layer, an active layer, and a second transparent electrode layer which are sequentially stacked, and light having a wavelength of about 440 nm-480 nm is absorbed within a depth of about ⅕ of an entire thickness of the active layer from both the top and bottom surfaces of the active layer.

The first transparent electrode layer may satisfy:

120$N$−(30−5$N$)≤refractive index of first transparent electrode layer×thickness (nm) of first transparent electrode layer≤120$N$+(30−5$N$), wherein $N$ is a natural number.

The image sensor may further include an optical buffer layer disposed at at least one of between the first transparent electrode layer and the active layer and under the first transparent electrode layer. The first transparent electrode layer and the optical buffer layer may satisfy:

120$N$−(30−5$N$)≤refractive index of first transparent electrode layer×thickness (nm) of first transparent electrode layer+refractive index of optical buffer layer×thickness (nm) of optical buffer layer≤120$N$+(30−5$N$), wherein $N$ is a natural number.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
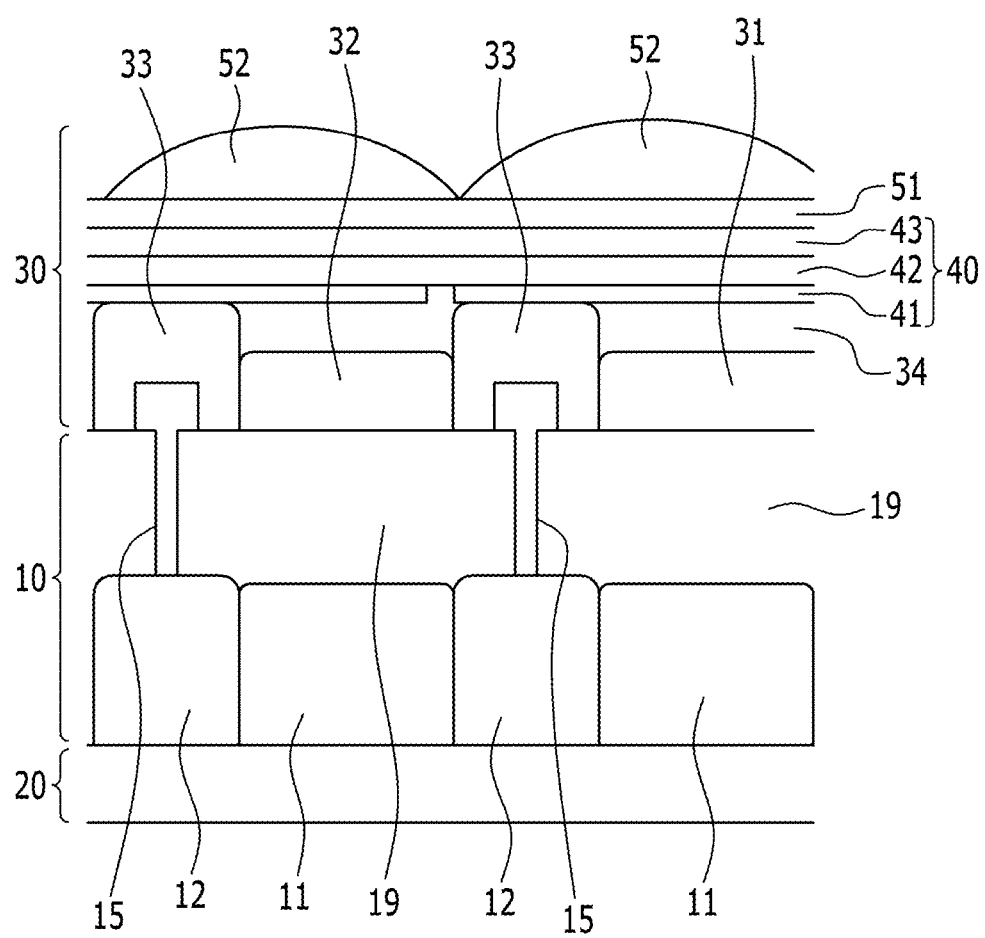
FIG. 1 is a cross-sectional view of an image sensor according to an example embodiment.

The example embodiments will be described more fully hereinafter with reference to the accompanying drawings, in which example embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

FIG. 1 is a cross-sectional view of an image sensor according to an example embodiment.

The image sensor of FIG. 1 includes a substrate portion 10, a stacking portion 30 disposed on the substrate portion 10, and a transmitting circuit portion 20 disposed under the substrate portion 10.

The substrate portion 10 includes a silicon substrate 19, and a photoelectric conversion device 11 and a green storage device 12 under the silicon substrate 19. The substrate portion 10 includes a plug 15 that passes through the silicon substrate 19 and connects the green storage device 12 with a conductive connecting member 33 of the stacking portion 30. Herein, the photoelectric conversion device 11 is a device that receives light and photo-electrically converts it into an electrical signal, and may be a CMOS (complementary metal-oxide semiconductor) device. The photoelectric conversion device 11 is connected to a wire of a transmitting circuit portion 20 through a switch (not shown). The green storage device 12 temporarily stores charges that the green light sensing organic material photoelectric conversion device 40 produces by absorbing green light.

The stacking portion 30 includes a red color filter 31 and a blue color filter 32, the conductive connecting member 33 contacting the plug 15, a green light sensing organic material photoelectric conversion device 40 disposed on the color filters 31 and 32 and the conductive connecting member 33, a protective layer 51 covering the green light sensing organic material photoelectric conversion device 40, and a lens layer 52 disposed on the protective layer 51. An insulating material layer 34 is disposed between the color filters 31 and 32 and the green light sensing organic material photoelectric conversion device 40. The insulating material layer 34 may be formed of a silicon oxide (SiO$_x$). The color filters 31 and 32 are disposed at the position corresponding to the photoelectric conversion device 11, and light transmitting through the color filters 31 and 32 enters the photoelectric conversion device 11. The green light sensing organic material photoelectric conversion device 40 includes a first electrode 41, a second electrode 43, and an organic semiconductor layer 42 interposed between the electrodes 41 and 43. The organic semiconductor layer 42 includes a material such as Fullerene (C60). Other materials performing selective photoelectric conversion of green light may also be used. The first electrode 41 is separated for each color region, and is electrically connected to the conductive connecting member 33. The second electrode 43 is integrally formed throughout the entire area of the sensor. The first electrode 41 and the second electrode 43 may consist of a transparent conductive material of Indium Tin oxide (ITO) or Indium Zinc Oxide (IZO) and the like. The conductive connecting member 33 electrically connects the first electrode 41 of the green light sensing organic material photoelectric conversion device 40 and the plug 15, and also acts as a light blocking member. The conductive connecting member 33 transfers photoelectric charges and/or signal generated by the green light sensing organic material photoelectric conversion device 40 to the green storage device 12 through the plug 15 which is connected to the green storage device 12. At the green storage device 12, the photoelectric charges are stored temporarily. The signal corresponding to the stored charges is transmitted by the transmitting circuit portion 20 for further processing. The lens layer 52 may include a plurality of convex lens disposed at each corresponding position to the color filters 31 and 32.

The normalized external quantum efficiency (EQE) of the green light sensing organic material photoelectric conversion device 40 has a variation within about 5% for the wavelength range from about 400 nm to about 650 nm when the applied bias voltage is changed from about 2 V to about 3 V. In order to provide the characteristics, blue light having a wavelength of about 440 nm-480 nm may be absorbed within a depth of ⅕ of the entire thickness of the active layer from both the top and bottom surfaces of the active layer. In order to provide the blue light absorption position, it satisfies the following Equation 1, wherein n1 refers to a refractive index of the first electrode 41 of the green light sensing organic material photoelectric conversion device 40, and d1 refers to a thickness.

$$120N-(30-5N) \leq n1 \times d1 \leq 120N+(30-5N), \text{ wherein } N \text{ is a natural number} \quad [\text{Equation 1}]$$

The transmitting circuit portion 20 includes a transmitting circuit wire (not shown). The transmitting circuit wire is connected to the photoelectric conversion device 11 and the green storage device 12 through a switching member or the like. When the photoelectric conversion device 11 and the green light sensing organic material photoelectric conversion device 40 receive light and convert the same into electrical signals, the transmitting circuit wire portion plays a role to deliver the electrical signals into a memory (not shown) or a data processor (not shown). The transmitting circuit portion 20 may be formed by attaching an additional substrate formed with a circuit to a substrate portion 10, or may be formed by stacking a wire layer and an insulation layer on the lower portion of substrate portion 10.

In the image sensor having a device structure of an example embodiment, light transmitted through the green light sensing organic material photoelectric conversion device 40 is passed through the color filters 31 and 32. The filters 31 and 32, filter the light, and only the red light and blue light are transmitted from the filter. The red light and blue light each enters/incidents into the photoelectric conversion device 11, wherein they are converted into a red light electrical signal and a blue light electrical signal, respectively.

In the image sensor having a device structure of an example embodiment, even if the bias voltage is changed within the driving voltage range of about 2 V to 3 V, the photoelectric conversion current caused by blue light generated in the green light sensing organic material photoelectric conversion device 40 is insignificantly changed. Accordingly, a change in the image color due to the change in the brightness of the ambient light will be reduced.

An example shown in FIG. 1 uses a green light sensing organic material photoelectric conversion device 40 and a red color filter 31 and a blue color filter 32, but different combination may be possible. For example, it may include a red light sensing organic material photoelectric conversion device and a green color filter and a blue color filter; or may include a blue light sensitive organic material photoelectric conversion device and a red color filter and a green color filter.

Figure 2:
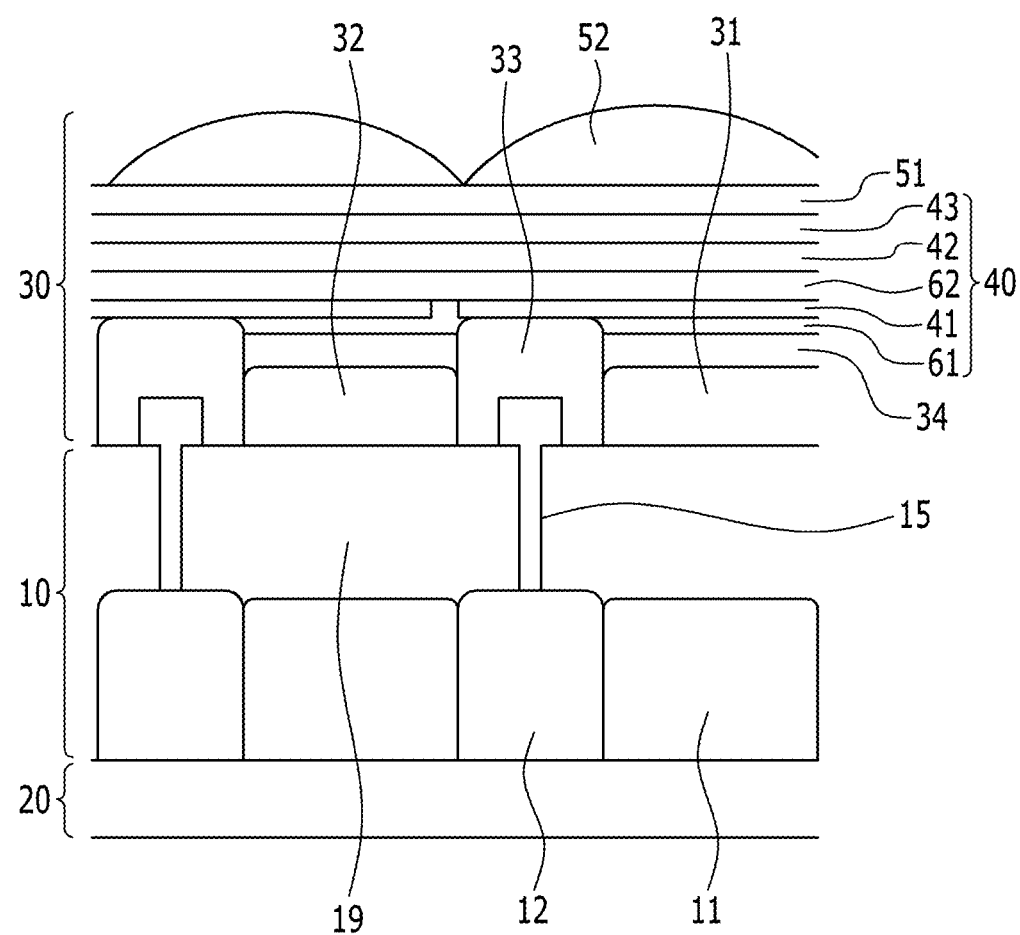
FIG. 2 is a cross-sectional view of an image sensor according to an example embodiment.

FIG. 2 is a cross-sectional view of an image sensor according to an example embodiment.

The image sensor of FIG. 2 includes a substrate portion 10, a transmitting circuit portion 20 disposed on the substrate portion 10, and a stacking portion 30 disposed on the transmitting circuit portion 20.

The structures of the substrate portion 10 and the transmitting circuit portion 20 are the same as in the image sensor of FIG. 1, and thus detailed descriptions are not provided herein.

The stacking portion 30 includes a red color filter 31 and a blue color filter 32, a conductive connecting member 33 contacting a plug 15, a green light sensing organic material photoelectric conversion device 40 disposed on the color filters 31 and 32 and the conductive connecting member 33, a protective layer 51 covering the green light sensing organic material photoelectric conversion device 40, and a lens layer 52 disposed on the protective layer 51. An insulating material layer 34 is disposed between the color filters 31 and 32 and the green light sensing organic material photoelectric conversion device 40. The insulating material layer 34 may be a silicon oxide ($SiO_x$). The color filters 31 and 32 are respectively disposed at the corresponding position to the photoelectric conversion device 11, and light transmitting through the color filters 31 and 32 enters the photoelectric conversion device 11. The green light sensing organic material photoelectric conversion device 40 includes a first electrode 41 a second electrode 43, and an organic semiconductor layer 42 interposed between the electrodes 41 and 43. Furthermore, the green light sensing organic material photoelectric conversion device 40 includes a first optical buffer layer 61 and a second optical buffer layer 62. The first optical buffer layer 61 is disposed between the insulating material layer 34 and the first electrode 41, and the second optical buffer layer 62 is disposed between the first electrode 41 and the organic semiconductor layer 42. The second optical buffer layer 62 may be a transparent organic material or inorganic material, and the difference between the refractive index thereof and the refractive index of first electrode 41 is greater than or equal to about 0.2. The first optical buffer layer 61 may be a transparent organic material or inorganic material, and the refractive index thereof is 0.2 greater than the refractive index of the insulating material layer 34. When the insulating material layer 34 is formed with a silicon oxide having a refractive index of about 1.5, the first optical buffer layer 61 is formed with a material having a refractive index of greater than or equal to about 1.7. The first optical buffer layer 61 and the second optical buffer layer 62 may be the same material or different materials. One of the first optical buffer layer 61 and the second optical buffer layer 62 may be omitted. The second optical buffer layer 62 may be formed with a material functioning as an electron transport layer (ETL) or a hole blocking layer. The organic semiconductor layer 42 includes a material such as C60 functioning for selective photoelectric conversion only for green light. The first electrode 41 is separated for each color region, and is electrically connected to the conductive connecting member 33. The second electrode 43 is integrally formed throughout the entire area of the sensor. The first electrode 41 and the second electrode 43 may consist of a transparent conductive material of ITO or IZO and the like. The conductive connecting member 33 electrically connects the first electrode 41 of the green light sensing organic material photoelectric conversion device 40 and the plug 15, and also acts as a light blocking member. The lens layer 52 may include a plurality of convex lens disposed at each position corresponding to the color filters 31 and 32.

Herein, the normalized external quantum efficiency (EQE) of green light sensing organic material photoelectric conversion device 40 is changed within about 5% for the wavelength range of about 400 nm to about 650 nm when the applied bias voltage is changed within about 2 V to about 3 V. In order to provide the characteristics, blue light having a wavelength of about 440 nm-480 nm may be absorbed within a depth of about ⅕ of the entire thickness of the active layer from both the top and bottom surfaces of the active layer. In order to provide the blue light absorption position, when the first electrode 41 of the green light sensing organic material photoelectric conversion device 40 has a refractive index of n1 and a thickness of d1, the first optical buffer layer 61 has a refractive index of n2 and a thickness of d2, and the second optical buffer layer 62 has a refractive index of n3 and a thickness of d3, it may satisfy the following Equation 2.

$$120N-(30-5N) \leq n1 \times d1 + n2 \times d2 + n3 \times d3 \leq 120N+(30-5N), \text{ wherein } N \text{ is a natural number} \quad \text{[Equation 2]}$$

In the image sensor having such structure, even if the bias voltage is changed within the driving voltage range of about 2 V to 3 V, the photoelectric conversion current caused by blue light generated in the green light sensing organic material photoelectric conversion device 40 is insignificantly changed, so that the image color is less changed and/or influenced due to the change in brightness.

The example shown in FIG. 2 uses a green light sensing organic material photoelectric conversion device 40 and a red color filter 31 and a blue color filter 32, but different combinations may be possible. For example, it may include a red light sensing organic material photoelectric conversion device and a green color filter and a blue color filter; or may include a blue light sensitive organic material photoelectric conversion device and a red color filter and a green color filter.

Hereinafter, the reasons why the external quantum efficiency (EQE) spectrum of the organic material photoelectric conversion device is changed according to voltage and the principle with which the examples of FIG. 1 and FIG. 2 prevent the same are explained.

Figure 3:
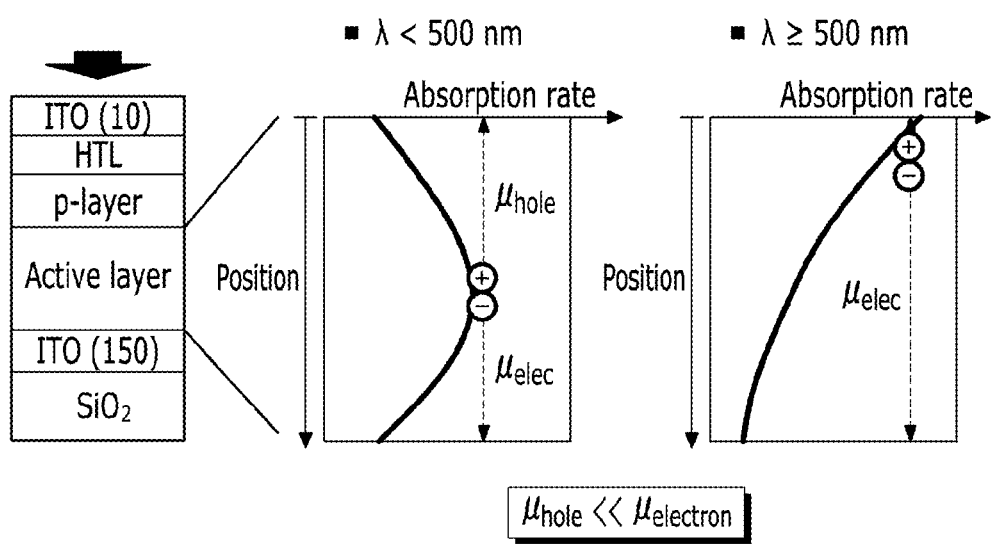
FIG. 3 is a graph showing an absorption rate along the depth/thickness of an active layer in a conventional green light sensing photoelectric conversion device.
Figure 4:
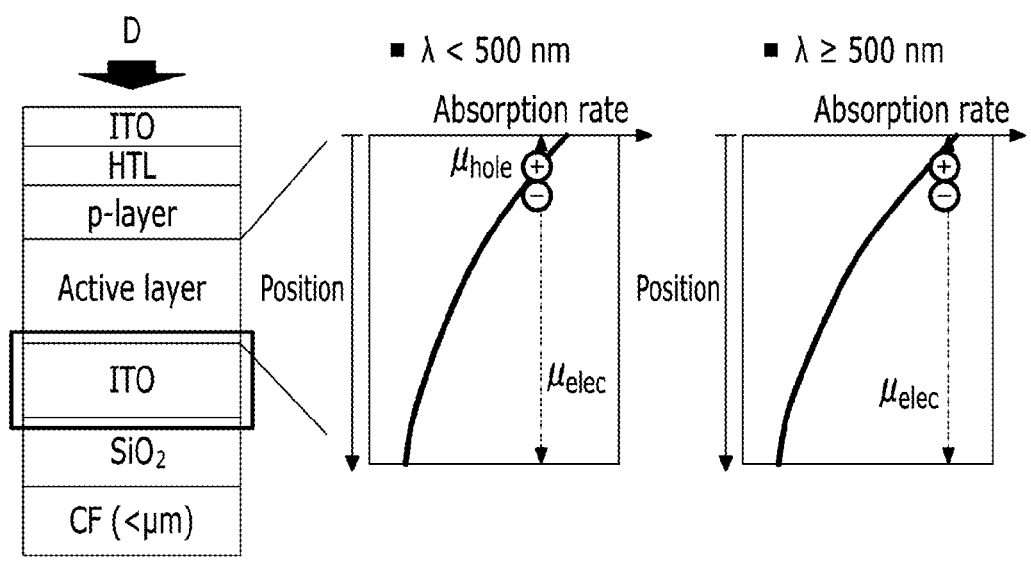
FIG. 4 and FIG. 5 are each a graph showing an absorption rate along the depth/thickness of an active layer in a green light sensing photoelectric conversion device according to an example embodiment.
Figure 5:
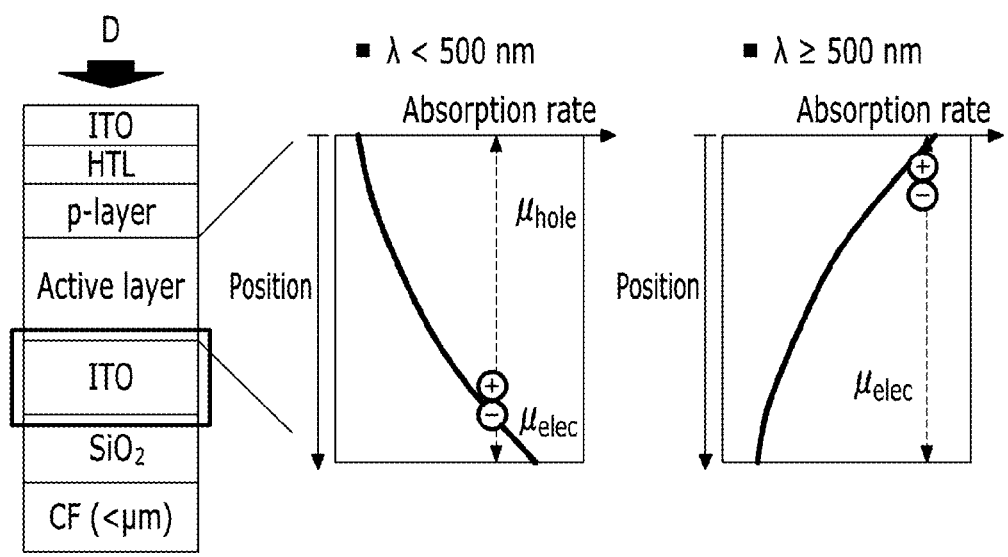
Figure 6:
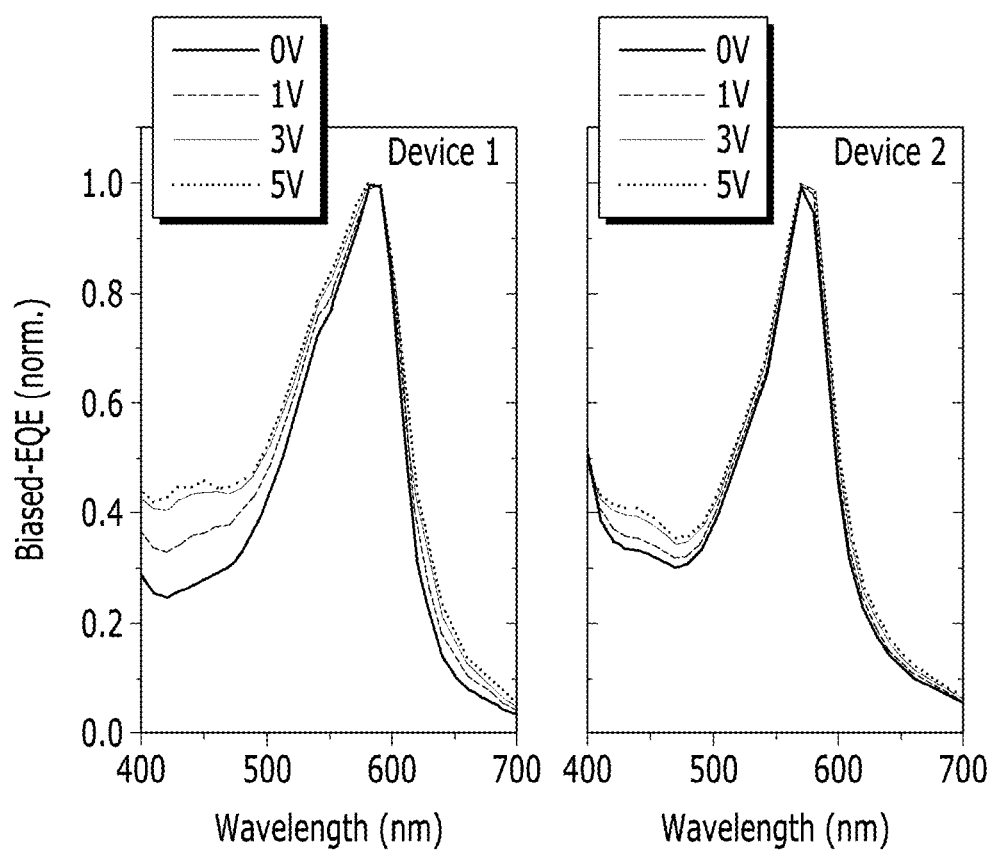
FIG. 6 is an external quantum efficiency graph (left) according to a bias voltage of the conventional green light sensing photoelectric conversion device, and an external quantum efficiency graph (right) according to a bias voltage of the green light sensing photoelectric conversion device according to an example embodiment.

FIG. 3 is a graph showing an absorption rate along the depth/thickness of active layer in the conventional green light sensing photoelectric conversion device; FIG. 4 and FIG. 5 are each a graph showing an absorption rate along the depth/thickness of the active layer in a green light sensing photoelectric conversion device according to an example embodiment; and FIG. 6 is an external quantum efficiency graph (left) according to the bias voltage of the conventional green light sensing photoelectric conversion device shown in FIG. 3 and an external quantum efficiency graph (right) according to the bias voltage of a green light sensing photoelectric conversion device according to an example embodiment.

First, referring to FIG. 3, the conventional green light sensing photoelectric conversion device has a structure in which a hole transport layer (HTL) and a p-layer and an active layer in which a p-type semiconductor and a n-type semiconductor are mixed are disposed between upper ITO (indium tin oxide) having a thickness of about 10 nm and lower ITO having a thickness of about 150 nm. Blue and red color filters and a semiconductor substrate formed with a photoelectric conversion device are disposed under the lower ITO, and an insulation layer ($SiO_2$) is disposed between the same and the lower structure to protect and/or planarize the lower structure. The insulation layer generally includes a silicon oxide ($SiO_x$).

In the green light sensing photoelectric conversion device having the structure, light having a wavelength ($\lambda$) of greater than or equal to about 500 nm is absorbed near the upper surface of active layer to generate a hole and an electron. The generated hole is transported to a p-layer of the upper part, and the electron is transported to a cathode of the lower ITO. The electron does not take a long time even if going across the active layer since the mobility thereof is greater than or equal to about 10 times that of the hole in the active layer, and the hole has a very short transporting distance in the active layer. Accordingly, the external quantum efficiency (EQE) is similar regardless of the bias voltage applied. However, light (blue light) having a wavelength ($\lambda$) of less than about 500 nm is absorbed near the middle part of active layer to generate a hole and an electron. Accordingly, the generated hole is transported a considerably farther distance to reach the p-layer of the upper part, and the time of transporting the hole to the p-layer of the upper part is significantly different according to the applied bias voltage. Thereby, the external quantum efficiency (EQE) is significantly changed according to the magnitude of the bias voltage.

Referring to FIG. 4, the green light sensing photoelectric conversion device, according to an embodiment, further includes an optical buffer layer disposed near the lower ITO or has a different thickness than that of the lower ITO compared to the conventional green light sensing photoelectric conversion device. Alternatively, the lower ITO is formed with a different transparent conductive material to change a refractive index.

In the green light sensing photoelectric conversion device having the structure, both light having a wavelength ($\lambda$) of greater than or equal to about 500 nm and light having a wavelength ($\lambda$) of less than about 500 nm are absorbed near the upper surface of the active layer to generate the hole and electron. The generated hole is transmitted to the p-layer of the upper part, and the electron is transmitted to a cathode of the lower ITO. The electron has higher mobility in the active layer than that of the hole by greater than or equal to about 10 times, so the electron may pass across the active layer within a short time, and the distance of the hole in the active layer is very short. Accordingly, the external quantum efficiency (EQE) is similar regardless of whether the bias voltage is applied or not.

In this way, in the green light sensing photoelectric conversion device according to an example embodiment, the position of absorbing light having a wavelength of less than 500 nm is changed to around the upper surface of the active layer by adjusting the thickness of the lower ITO or by providing the optical buffer layer near the lower ITO. Thereby, the external quantum efficiency (EQE) is less affected by the external bias voltage.

Referring to FIG. 5, the green light sensing photoelectric conversion device according to an example embodiment may further include an optical buffer layer disposed near the lower ITO or has a different thickness of the lower ITO compared to the conventional green light sensing photoelectric conversion device. Comparing the green light sensing photoelectric conversion device, with an example embodiment, the thickness of the lower ITO is different, or a thickness or a refractive index of the optical buffer layer disposed near the lower ITO is different. Alternatively, the lower ITO is formed with a different transparent conductive material to change the refractive index thereof.

Even in the green light sensing photoelectric conversion device having the structure, light having a wavelength ($\lambda$) of greater than or equal to about 500 nm is absorbed in the vicinity of the upper surface of the active layer to generate a hole and an electron. The generated hole is transported to the upper p-layer, and the electron is transported to a cathode of the lower ITO. The electron has higher mobility in the active layer than that of the hole by greater than or equal to about 10 times, so the electron may pass across the active layer within a short time, and the distance of the passing hole in the active layer is very short. Accordingly, the external quantum efficiency (EQE) is similar regardless of whether the bias voltage is applied or not. However, light (blue light) having a wavelength ($\lambda$) of less than about 500 nm is adsorbed near the lower surface of the active layer to generate a hole and an electron. Accordingly, the generated hole may be transported a very long distance to reach the upper p-layer. Thus, under the bias voltage of around 2 V-3 V which is a driving voltage, the time of transporting the hole to the upper p-layer is much delayed even in any case. Accordingly, the external quantum efficiency (EQE) is similar regardless of the amplitude of the bias voltage.

In this way, in the green light sensing photoelectric conversion device according to one embodiment, the position of absorbing light having a wavelength of less than about 500 nm is shifted to around the upper surface of the active layer by adjusting a thickness of the lower ITO or by providing an optical buffer layer near the lower ITO, and thereby, the external quantum efficiency (EQE) is less affected by the external bias voltage.

Referring to FIG. 6, in case of the left graph (conventional green light sensing photoelectric conversion device), the external quantum efficiency is expanded with a considerable gap according to the bias voltage in a wavelength region of less than or equal to about 500 nm. Comparing this, with the right graph (color light sensing photoelectric conversion device according to an example embodiment), the external quantum efficiency is changed within a narrow gap according to the bias voltage in a wavelength region of less than or equal to about 500 nm.

Hereinafter, by adjusting a thickness or a refractive index of the lower transparent electrode of the green light sensing photoelectric conversion device or by providing an additional optical buffer layer, the simulation results of shifting the absorption position are examined.

Figure 7A:
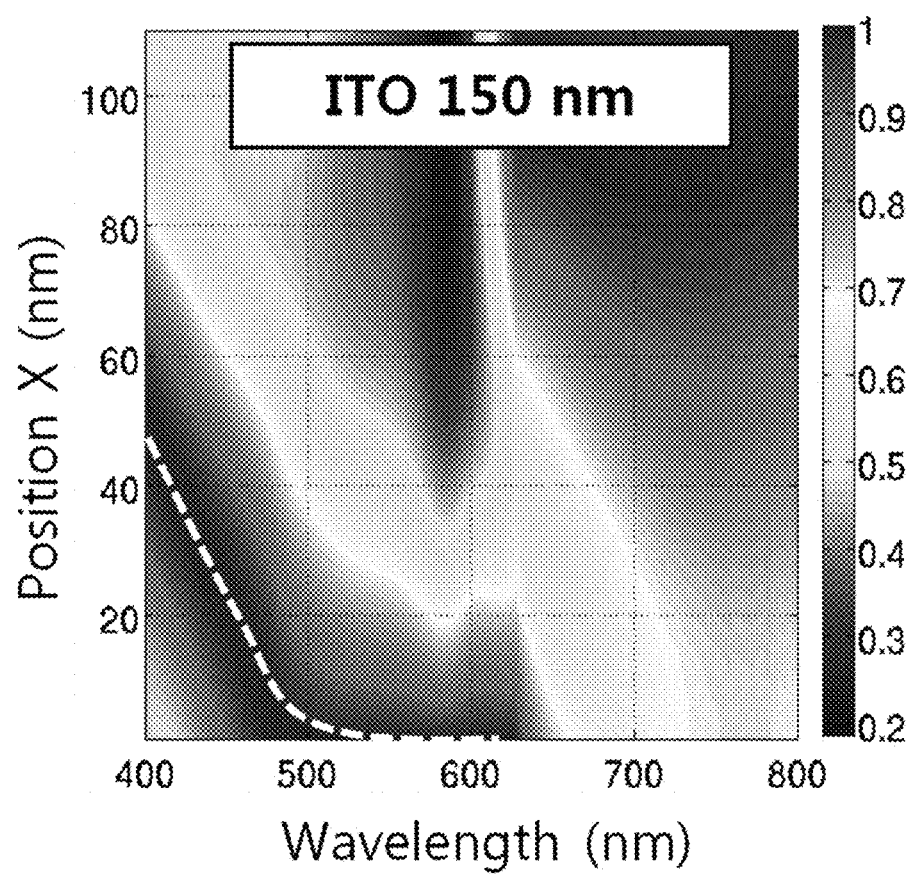
FIG. 7A is a graph showing a light absorption position according to wavelength in the conventional green light sensing photoelectric conversion device.
Figure 7B:
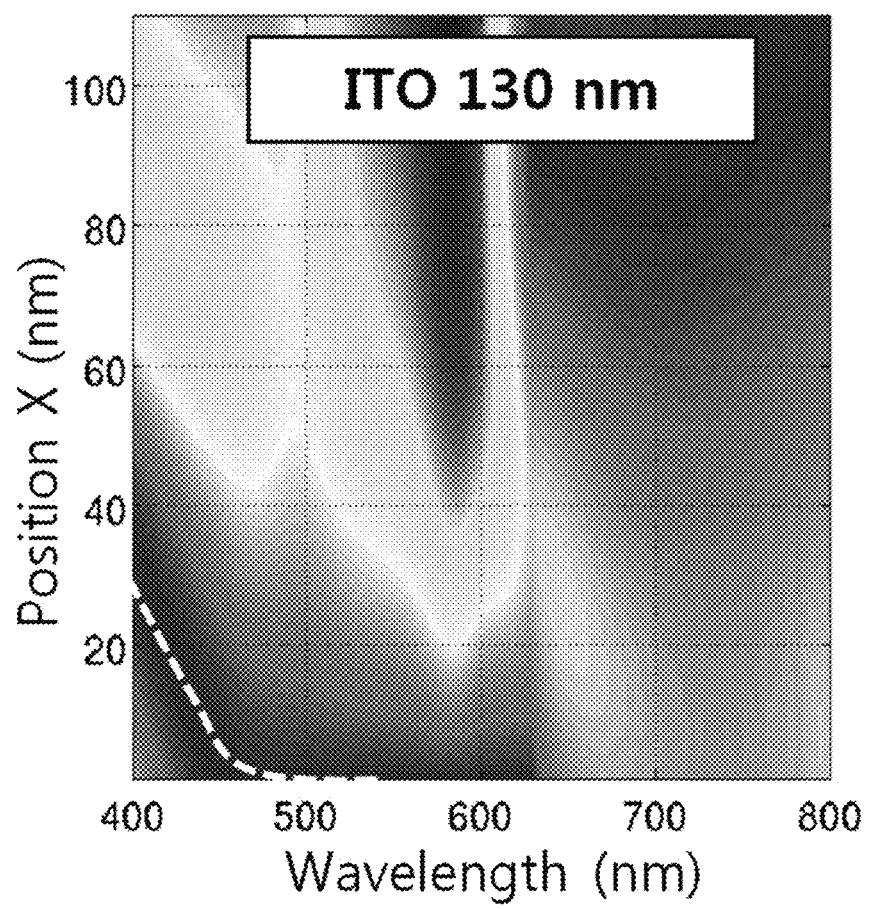
FIG. 7B is a graph showing a light absorption position according to wavelength in the green light sensing photoelectric conversion device in which the thickness of a lower transparent electrode layer is adjusted to 130 nm.
Figure 7C:
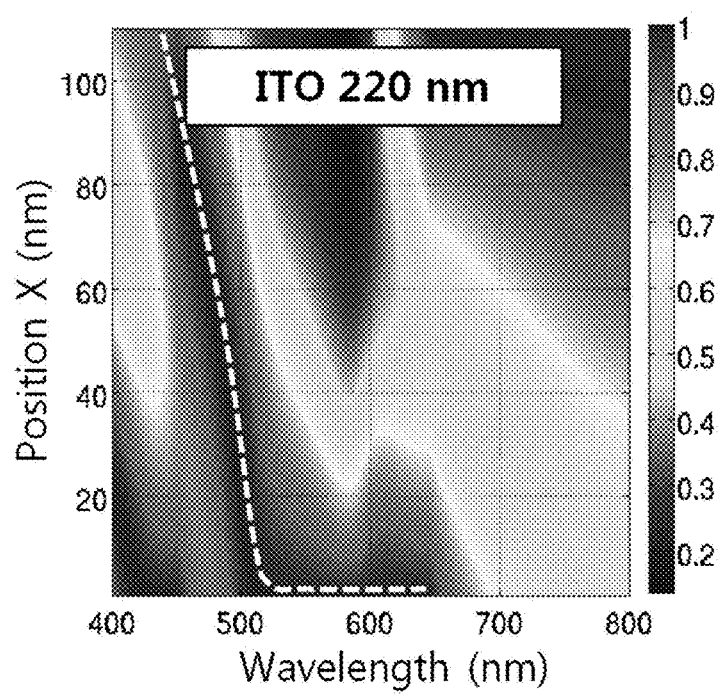
FIG. 7C is a graph showing a light absorption position according to wavelength in the green light sensing photoelectric conversion device in which the thickness of a lower transparent electrode layer is adjusted to 220 nm.
Figure 7D:
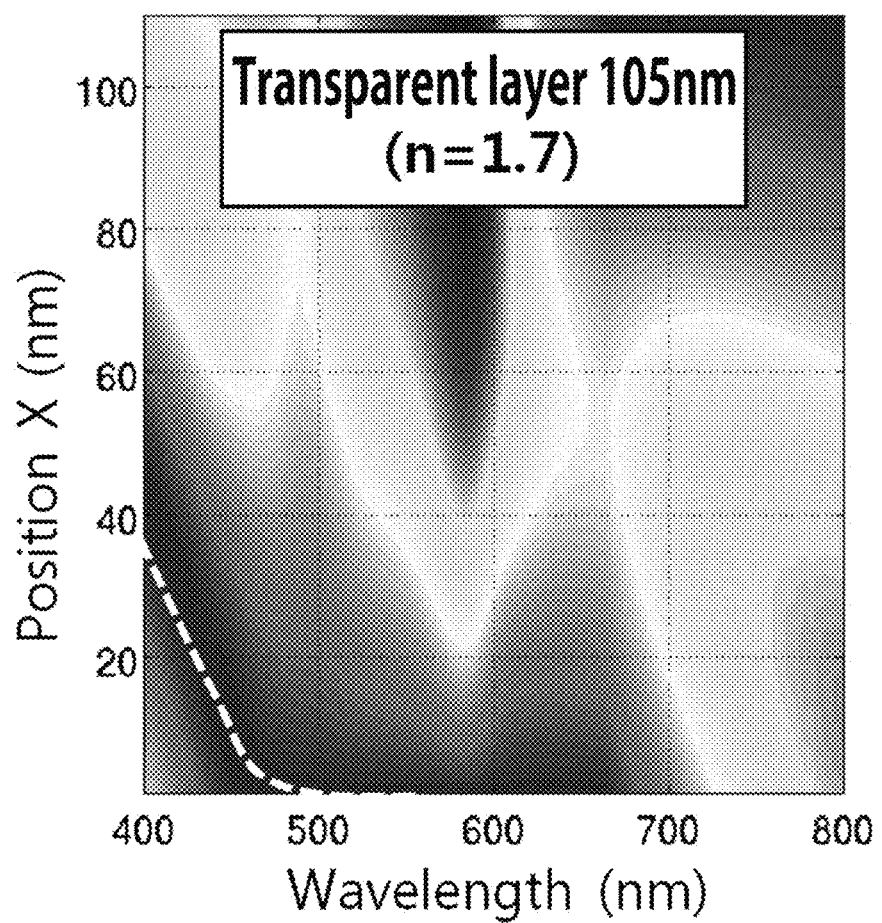
FIG. 7D is a graph showing a light absorption position according to wavelength in the green light sensing photoelectric conversion device in which an optical buffer layer having a refractive index of 1.7 and a thickness of 105 nm is added under the lower transparent electrode.
Figure 7E:
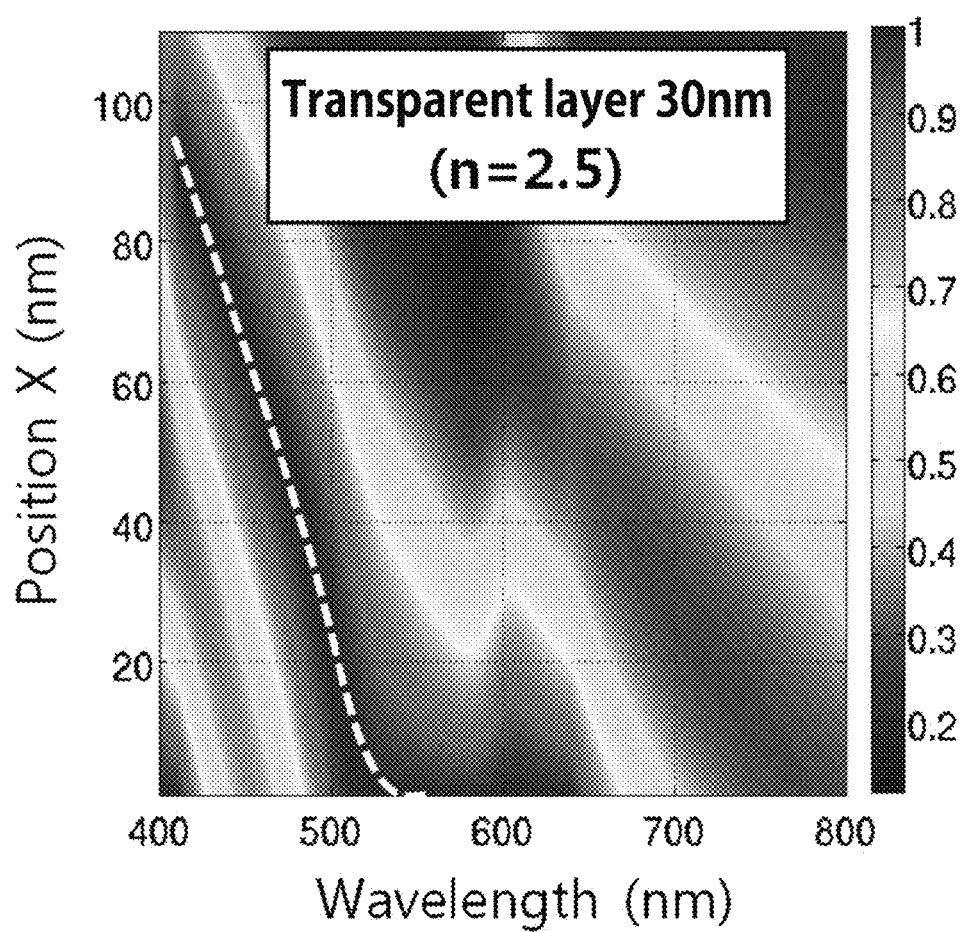
FIG. 7E is a graph showing a light absorption position according to wavelength in the green light sensing photoelectric conversion device in which an optical buffer layer having a refractive index of 2.5 and a thickness of 30 nm is added under the lower transparent electrode.

FIG. 7A is a graph showing a light absorption position according to wavelength in the conventional green light sensing photoelectric conversion device; FIG. 7B is a graph showing a light absorption position according to wavelength in the green light sensing photoelectric conversion device in which the thickness of the lower transparent electrode layer is adjusted to 130 nm; FIG. 7C is a graph showing a light absorption position according to wavelength in the green light sensing photoelectric conversion device in which the thickness of the lower transparent electrode layer is adjusted to 220 nm; FIG. 7D is a graph showing a light absorption position according to wavelength in the green light sensing photoelectric conversion device in which an optical buffer layer having a refractive index of 1.7 and a thickness of 105 nm is further provided under the lower transparent electrode; and FIG. 7E is a graph showing a light absorption position according to wavelength in the green light sensing photoelectric conversion device in which an optical buffer layer having a refractive index of 2.5 and a thickness of 30 nm is further provided under the lower transparent electrode.

Referring to FIG. 7A, in case of the conventional green light sensing photoelectric conversion device, the absorption position (Position X, dotted line) begins to rise from a wavelength of about 500 nm and approaches about 50, which is almost the middle, at a wavelength of about 400 nm.

Comparing this, in FIG. 7B, by adjusting the thickness of the lower transparent electrode layer to about 130 nm, the absorption position (Position X, dotted line) stays around 30 even at a wavelength of about 400 nm. The absorption position (Position X, dotted line) means a distance from the upper surface (surface contacting p-layer) of the active layer, so it is understood that the position of absorbing light having the blue region is nearer to the upper surface in the case of FIG. 7B than the case of FIG. 7A.

In the case of FIG. 7C, by adjusting a thickness of the lower transparent electrode layer to about 220 nm, the absorption position (Position X, dotted line) having a wavelength of less than or equal to about 450 nm is near the lower surface.

In the case of FIG. 7D, the absorption position (Position X, dotted line) may be shifted to less than about 40 at a wavelength of about 400 nm by providing an optical buffer layer having a thickness of about 105 nm formed with a material having a refractive index of about 1.7 near to the lower transparent electrode layer.

In the case of FIG. 7E, the absorption position (Position X, dotted line) may be shifted to about 100 at a wavelength of about 400 nm by providing an optical buffer layer having a thickness of about 30 nm formed with a material having a refractive index of about 2.5 near the lower transparent electrode layer.

Summarizing the results, when the position of absorbing the blue region light in the active layer is shifted near the upper surface or near the lower surface of the active layer, the external quantum efficiency (EQE) may be changed within a small range even if changing a bias voltage from about 2 V to about 3 V.

Figure 8:
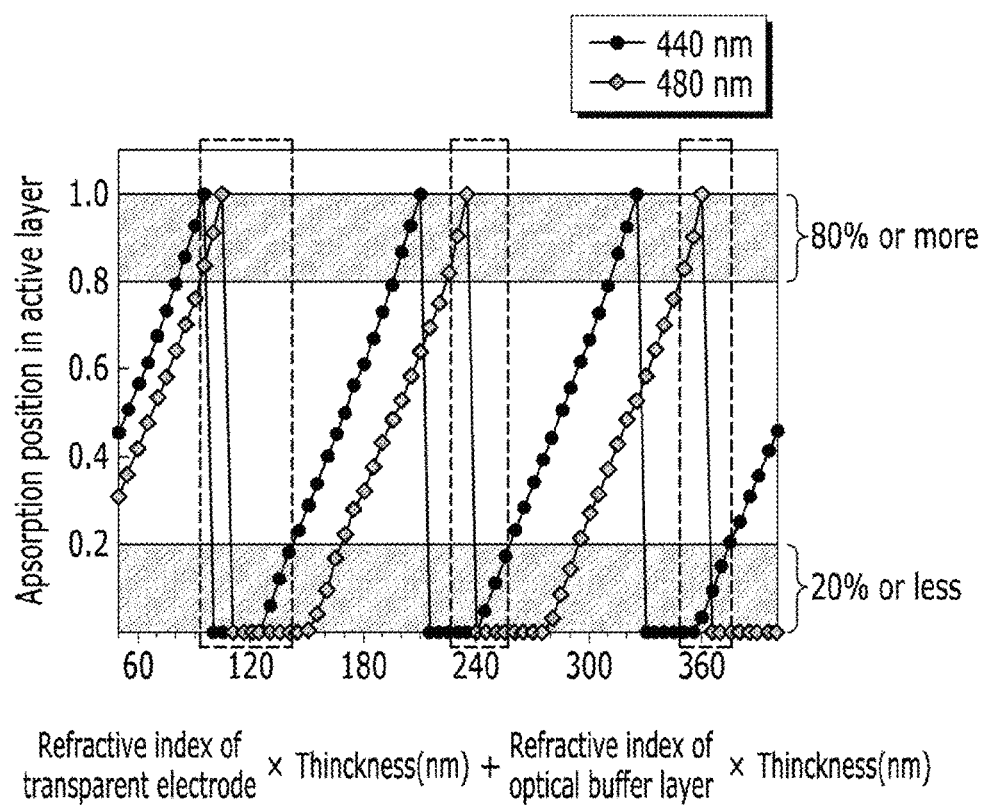
FIG. 8 is a graph showing an absorption position change and/or shift of blue light (440 nm, 480 nm) in the active layer according to "refractive index of the transparent electrode layer×thickness (nanometer) of the transparent electrode layer+refractive index of the optical buffer layer×thickness (nanometer) of the optical buffer layer".

FIG. 8 is a graph showing the absorption position change of blue light (440 nm, 480 nm) in the active layer according to "refractive index of the transparent electrode layer× thickness (nanometer) of the transparent electrode layer+ refractive index of the optical buffer layer×thickness (nanometer) of the optical buffer layer".

In FIG. 8, the value (x) of the horizontal axis in the case of the example of FIG. 1 is n1×d1, and that in the case of the example of FIG. 2 is n1×d1+n2×d2+n3×d3. When the bias voltage is changed from about 2 V to about 3 V, in order to maintain the variation of the external quantum efficiency (EQE) in the wavelength range from about 400 nm to about 650 nm within about 5%, the position of absorbing blue light may be calculated to be located within about 20% or at greater than or equal to about 80% with reference to the position of absorbing green light. In other words, the light having a wavelength of about 440 nm-480 nm may be absorbed within a depth of ⅕ of the entire thickness of the active layer from both the top and bottom surfaces of the active layer. In FIG. 8, when the position of absorbing blue light (440 nm, 480 nm) is positioned within the region surrounded by the dotted line, and when the bias voltage is changed within about 2 V to about 3 V, the external quantum efficiency (EQE) variation may be maintained within about 5 for the wavelength range of about 400 nm to about 650 nm.

The value x of the region surrounding the dotted line in FIG. 8 satisfies the following Equation 3.

$$120N-(30-5N) \leq x \leq 120N+(30-5N), \text{ wherein } N \text{ is a natural number} \quad \text{[Equation 3]}$$

Equation 3 is the case of using C60 as an active layer, and Equation 3 may be changed when using a different material as an active layer material.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An image sensor comprising:
a first photoelectric conversion device including a first transparent electrode layer, an active layer having top and bottom surfaces, and a second transparent electrode layer which are sequentially stacked, wherein
the first photoelectric conversion device is a green light sensing photoelectric conversion device, and
light having a wavelength of 440 nm-480 nm is absorbed within a depth of ⅕ of an entire thickness of the active layer from both the top and bottom surfaces of the active layer.

2. The image sensor of claim 1, wherein the first transparent electrode layer satisfies:

$$120N-(30-5N) \leq \text{refractive index of the first transparent electrode layer} \times \text{thickness (nanometer) of the first transparent electrode layer} \leq 120N+(30-5N),$$
wherein $N$ is a natural number.

3. The image sensor of claim 2, wherein the first transparent electrode layer includes Indium Tin Oxide (ITO).

4. The image sensor of claim 3, further comprising:
a P-type doping layer and a hole transport layer (HTL) between the active layer and the second transparent electrode layer.

5. The image sensor of claim 3, further comprising:
a substrate including a second photoelectric conversion device under the first transparent electrode layer; and
a first color filter, a second color filter, a conductive connecting member, and an insulation layer between the substrate and the first transparent electrode layer,
wherein the insulation layer is between the first transparent electrode layer and the first color filter, and between the first transparent electrode layer and the second color filter.

6. The image sensor of claim 5, wherein the insulation layer includes silicon oxide.

7. The image sensor of claim 2, wherein the active layer includes Fullerene (C60).

8. The image sensor of claim 1, further comprising:
a substrate including at least a second photoelectric conversion device under the first transparent electrode layer; and
an optical buffer layer disposed at least one of between the first transparent electrode layer and the active layer, and between the first transparent electrode layer and the substrate.

9. The image sensor of claim 8, wherein the first transparent electrode layer and the optical buffer layer satisfy:

120N−(30−5N)≤refractive index of the first transparent electrode layer×thickness (nanometer) of the first transparent electrode layer+refractive index of the optical buffer layer×thickness (nanometer) of the optical buffer layer≤120N+(30−5N), wherein N is a natural number.

10. The image sensor of claim 9, wherein a difference between the refractive index of the optical buffer layer and the refractive index of the first transparent electrode layer is greater than or equal to 0.2.

11. The image sensor of claim 10, wherein the optical buffer layer plays a role of a hole blocking layer or an electron transport layer (ETL).

12. The image sensor of claim 8, wherein the optical buffer layer includes a first optical buffer layer between the first transparent electrode layer and the active layer, and a second optical buffer layer between the first transparent electrode layer and the substrate.

13. The image sensor of claim 12, wherein the first transparent electrode layer, the first optical buffer layer, and the second optical buffer layer satisfy:

120N−(30−5N)≤refractive index of the first transparent electrode layer×thickness (nanometer) of the first transparent electrode layer+refractive index of the first optical buffer layer×thickness (nanometer) of the first optical buffer layer+refractive index of the second optical buffer layer×thickness (nanometer) of the second optical buffer layer≤120N+(30−5N), wherein N is a natural number.

14. The image sensor of claim 13, wherein the first optical buffer layer plays a role of a hole blocking layer or an electron transport layer (ETL).

15. An image sensor comprising:
a photoelectric conversion device including an optical buffer layer;
a first transparent electrode layer on the optical buffer layer;
an active layer on the first transparent electrode layer; and
a second transparent electrode layer on the active layer, wherein
a refractive index of the optical buffer layer is greater than or equal to 1.7,
the photoelectric conversion device is a green light sensing photoelectric conversion device, and
light having a wavelength of 440 nm-480 nm is absorbed within a depth of ⅕ of an entire thickness of the active layer from both top and bottom surfaces of the active layer.

16. The image sensor of claim 15, wherein the first transparent electrode layer and the optical buffer layer satisfy:

120N−(30−5N)≤refractive index of the first transparent electrode layer×thickness (nanometer) of the first transparent electrode layer+refractive index of the optical buffer layer×thickness (nanometer) of the optical buffer layer≤120N+(30−5N), wherein N is a natural number.

17. The image sensor of claim 16, further comprising:
a P-type doping layer and a hole transport layer (HTL) between the active layer and the second transparent electrode layer, and an insulation layer under the optical buffer layer, wherein
the first transparent electrode layer includes Indium Tin Oxide (ITO),
the active layer includes Fullerene (C60), and
the insulation layer includes silicon oxide.

18. A photoelectric conversion device, comprising:
a first transparent electrode layer, an active layer having top and bottom surfaces, and a second transparent electrode layer which are sequentially stacked, wherein
the photoelectric conversion device is a green light sensing photoelectric conversion device, and
light having a wavelength of 440 nm-480 nm is absorbed within a depth of ⅕ of an entire thickness of the active layer from both the top and bottom surfaces of the active layer.

19. The photoelectric conversion device of claim 18, wherein the first transparent electrode layer satisfies:

120N−(30−5N)≤refractive index of the first transparent electrode layer×thickness (nanometer) of the first transparent electrode layer≤120N+(30−5N), wherein N is a natural number.

20. The photoelectric conversion device of claim 18, further comprising:
an optical buffer layer disposed at least one of between the first transparent electrode layer and the active layer, and under the first transparent electrode layer, and
wherein the first transparent electrode layer and the optical buffer layer satisfy:

120N−(30−5N)≤refractive index of the first transparent electrode layer×thickness (nanometer) of the first transparent electrode layer+refractive index of the optical buffer layer×thickness (nm) of the optical buffer layer≤120N+(30−5N), wherein N is a natural number.

* * * * *